United States Patent [19]

Kim

[11] Patent Number: 6,031,590
[45] Date of Patent: Feb. 29, 2000

[54] STRUCTURE AND METHOD OF MOUNTING DRIVER IC USING ANISOTROPIC CONDUCTIVE FILM IN LIQUID CRYSTAL DISPLAY DEVICE

[75] Inventor: Seong Jin Kim, Seoul, Rep. of Korea

[73] Assignee: LG Electronics Inc., Seoul, Rep. of Korea

[21] Appl. No.: 09/010,139

[22] Filed: Jan. 21, 1998

[30] Foreign Application Priority Data

Jan. 22, 1997 [KR] Rep. of Korea .......................... 97-1798

[51] Int. Cl.⁷ .................................................. G02F 1/1333
[52] U.S. Cl. ............................. 349/86; 349/149; 349/150
[58] Field of Search ..................................... 349/149, 150, 349/151, 152, 153, 154; 156/247

[56] References Cited

U.S. PATENT DOCUMENTS

| | | |
|---|---|---|
| 4,721,365 | 1/1988 | Nishimura ................................ 350/336 |
| 5,223,965 | 6/1993 | Ota et al. .................................... 359/88 |
| 5,749,997 | 5/1998 | Tang et al. ............................... 156/249 |
| 5,844,314 | 12/1998 | Kim ......................................... 257/737 |
| 5,861,661 | 1/1999 | Tang et al. ............................... 257/668 |

FOREIGN PATENT DOCUMENTS

| | | |
|---|---|---|
| 7-218926 | 8/1995 | Japan . |
| 7-244291 | 9/1995 | Japan . |

*Primary Examiner*—William L. Sikes
*Assistant Examiner*—James A. Dudek
*Attorney, Agent, or Firm*—Morgan, Lewis & Bockius LLP

[57] ABSTRACT

A structure and method of mounting a driver IC using an anisotropic conductive film (ACF) in a liquid crystal display device is disclosed. ACFs are used in bonding a FPC (Flexible Printed Circuit) and in a COG (Chip on Glass) process at the same time. A film according to the present invention comprises a support film, a COG ACF adhered on one portion of the support film and a FPC ACF adhered on the other portion of the support film. Using the film disclosed in the present invention, the manufacturing process of the LCD panel becomes simpler and easier.

20 Claims, 13 Drawing Sheets

STRUCTURE AND METHOD OF MOUNTING DRIVER IC USING ANISOTROPIC CONDUCTIVE FILM IN LIQUID CRYSTAL DISPLAY DEVICE

BACKGROUND OF THE INVENTION

1. Field of the Invention

The present invention relates to the method for mounting the ACF(Anisotropic Conductive Film) for FPC and COG (Chip On Glass), at the same time. Especially, the present invention relates to the method for reducing the manufacturing steps for mounting driver ICs using ACF in COG structure.

2. Description of the Background Art

The CRT(Cathode Ray Tube), the most general display device, reproduce the color display information using electron guns for a red color, a green color and a blue color. The thickness of the CRT must be thicker and thicker when the screen size is becoming lager and larger. Because the CRT device can reproduce the images only if the distance between the electron guns and the screen of the CRT is enough. So, the CRT device is no more a proper device when the small private display device, like TV, is replace with the large public device, like a beam projector.

In recent year, many flat display devices alternating the CRT are developed. Among them, a liquid crystal display (LCD) device has become more popular than others. Conventionally, the LCD comprises, as shown in FIG. 1, a controller IC 13, a scan line driver IC 11, a data line driver IC 10 and an array of thin film transistors(or TFT array) 16. A plurality of scan lines 15 is connected to the out line of the scan line driver IC 11, and a plurality of data lines 14 is connected to the out line of the data line driver IC 10. At the intersection area of the scan lines 15 and the data lines 14, thin film transistors 16 connecting with pixels 17 are arrayed. A gate electrode of the thin film transistor 16 is connected to the scan line 15 and a source electrode is connected to the data line 14 and a drain electrode is connected to the pixel electrode 17. When certain voltage is applied to the gate electrode of the TFT 16, then the source electrode of the TFT 16 and the drain electrode are electrically connected. And if there is no voltage at the gate electrode the source and the drain electrodes are electrically isolated.

The conventional method for reproduce the image information in the LCD device is like below. The image information is converted into a data voltage at the controller IC 13 and the data voltage is held at the data line driver IC 10. The data line driver IC 10 put out the data voltage to the data line 14 according to the scan signal. For example, when the scan line driver IC 11 put out the scan voltage at the first scan line 15 according to the predetermined frequency signal, the TFTs 16 connected to the first scan line 15 are turn on and the data voltages of the first line of the image information are applied to the first line of the pixel 17 electrode array. And then, when the scan line driver IC 11 put out the scan voltage at the second scan line 15, the data line driver IC 10 put out the second line of the image information are applied to the second line of the pixel 17 electrode array. With the same method as mentioned above, the other lines of the image information applied to the other lines of the pixel 17 electrode array. So, the image information is reproduced at the screen of the LCD.

Referring to cross sectional view of the LCD shown as in the FIG. 2, the LCD comprises a lower plate 21 having the TFT 16 arrays and a higher plate 20 having a common electrode 23 and a color filter 22. Generally, the lower plate 21 is larger than the higher plate 20. The reason is that the lower plate 21 should have a second space 26 for mounting driver ICs(27, 28) and for FPC connecting to the driver Ics(27, 28), except the first space 25 for the TFT 16 arrays.

Generally, when the driver IC or the FPC is mounted to certain device, an anisotropic conductive film(ACF) coating an anisotropic conductive adhesive on a protective film is used. Referring to the FIG. 3, the ACF have the structure in which the conductive balls are scattered in the adhesive resin 30. The conductive ball comprises a conductive sphere 32 covered with a thin insulation membrane 31. The insulation membrane 31 can be easily broken under pressure. So, when two electrodes should be electrically connected, the ACF inserted between the two electrode and pressed. Then the insulation membrane 31 is broken and the conductive sphere 32 is connected with the two electrode.

There is an tape automated bonding(TAB) method for connecting the driver IC and terminal pad of the TFT arrays. The TAB method comprises an inner lead bonding(ILB) step and an outer lead bonding(OLB) step in which a film having conductive bus lines are connected with electrodes of the driver IC. The ILB step is to connect the electrode of driver IC to one side of a film lead with a bump, and the OLB step is to connect the terminal pad to the other side of the film lead. Referring to the FIG. 4, the TAB method is explained more detail. The bumps 41 are formed on the electrode 40 of the driver IC() (FIG. 4a). One side of a polyimide film 43 having conductive bus lines is mounted on the bumps 41(FIG. 4b). The bumps 41 and the film 43 are bonded by pressing with high temperature. Additionally, a protective resin 44 is coated on the connected part in order to enhance the resist against the moisture or stress (FIG. 4c). After that, the another side of the polyimide film is connected to the terminal pad of the LCD with an ACF using the similar process. Here, the conductive balls embedding in the polyimide film are connected to the lead line and the terminal pad. Consequently, in the TAB method, the driver IC is mounted out side of the LCD panel and the driver IC is connected to the terminal of the LCD using a film having conductive bus lines.

Another method is a chip on glass(COG) method in which the driver ICs are manufactured on the glass of the LCD panel. In the COG method, the driver ICs are connected to the terminal pad with the bumps and the ACF film instead of using the polyimide film having conductive bus lines in TAB method. Therefore, the manufacturing process and the structure of the LCD is more simple. Furthermore, the screen area is larger in the same size of the glass panel.

Referring to the FIG. 5, the mounting method for driver ICs by the COG is explained. On the terminal pad 52 formed on the glass 50 of the LCD panel, an anisotropic conductive film(ACF) 30 having conductive balls 51 is mounted (FIG. 5a). A driver IC having bumps 53 on the electrode is arranged on the ACF 30. And the driver IC and the terminal pad are pressed to adhere each other. So, the conductive balls 51 are connect the terminal pad and the electrode of the IC 51 as the insulation membrane covering the conductive ball 51 are broken. Finally, high temperature(over 120 centigrade) is applied to the ACF to harden it, so the driver IC is adhered on the glass safely.

Referring to FIG. 6, the method for mounting the ACF on the terminal pad or electrode is explained. An ACF 61 having the similar size with the terminals or electrode wanted to mounting is weakly adhered on a protection film 60(FIG. 6a). The ACF 61 is mounted on the terminal 62 with alignment(FIG. 6b). Here, the protection film 60 is protects the ACF 61 from the pollution materials. On the protection film 60, a pressure is applied with a temperature(about 100 centigrade). Then, the protection film 60 is depart from the ACF and the ACF adheres on the terminal 62. Because the adhesion between the ACF and the terminal is more strong than that of the ACF and the protection film.

Referring to the mentioned above, the manufacturing method for the lower plate of the LCD will be explained as shown FIGS. 7 and 8. On the substrate 70, a gate electrode 71 and a scan line(not shown) are formed using a metal(FIG. 7). On the gate electrode and the scan line, a first insulation layer 72 is deposited(FIG. 7b). A source electrode 74, a drain electrode 73 and a data line are formed on the first insulation layer 72 using a metal(FIG. 7c). A doped semiconductor layer 75 and a intrinsic semiconductor layer 76 are formed sequently. After that, a second insulation layer 77 is deposited and a contact hole for exposing the drain electrode 73(FIG. 7d). A pixel electrode 78 connecting to the drain electrode 73 is formed on the second insulation layer 77(FIG. 7e).

At the first area 25 of the substrate 70, the TFT arrays mentioned above are formed. And at the boundary area of the first area and the second area, the terminals of the scan lines and data lines are formed. At the second area 26 of the substrate 70, there are two area. One area is chip boding area 81 in which the driver ICs are mounted. The other area is FPC bonding area 82 in which FPCs applied input data from the video controller are mounted. At the boundary area and the chip bonding area, a first ACF for COG is adhered. At the FCP bonding area, a second ACF of FPC is adhered. After that, a driver IC 83 is mounted on the first ACF to connect to the terminals of scan and data lines, and a FPC 84 is mounted on the second ACF.

Generally, the ACFs for COG and FPC are made and supplied in different ways. So, in order to adhere the ACFs for COG and FPC, two steps are needed. However, the ACFs for COG and FPC are similar materials, so the processing for adhere the ACFs is duplicated without any meaning. Furthermore, tolerances are occurred when the two types ACF are mounted in separated processes. So, the quality of the LCD is hindered. And the manufacturing tools and tact time are wasted. Especially, in the large LCD panel such as over 12 inch, it is necessary to reduce the alignment tolerance for connecting the FPC and the driver IC, because the number of driver IC is large and the length of the ACF is long. Additionally, the distance between the ACFs for COG and FPC is so short that the hardening process of one ACF should give unpredicted results to the other ACF.

SUMMARY OF THE INVENTION

The present invention comprises an ACF protective film, a ACF for COG adhered on the one portion of the protective film and a ACF for FPC adhered on the other portion of the protection film in order to solve the above mentioned problems. And using the ACF protection film, the LCD panel has more simple structure and the manufacturing process is easier. Referring to some preferred embodiments, we will explain the present invention more detail.

BRIEF DESCRIPTION OF THE ATTACHED DRAWINGS

DETAILED DESCRIPTION OF THE PREFERRED EMBODIMENTS

Preferred Embodiment 1

Figure 1:
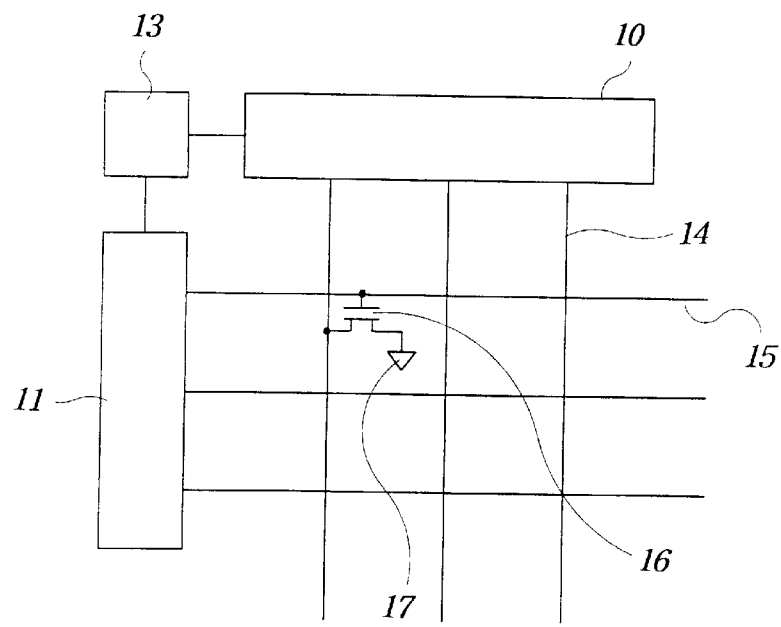
FIG. 1 shows the general structure of the conventional liquid crystal display device.
Figure 2A:
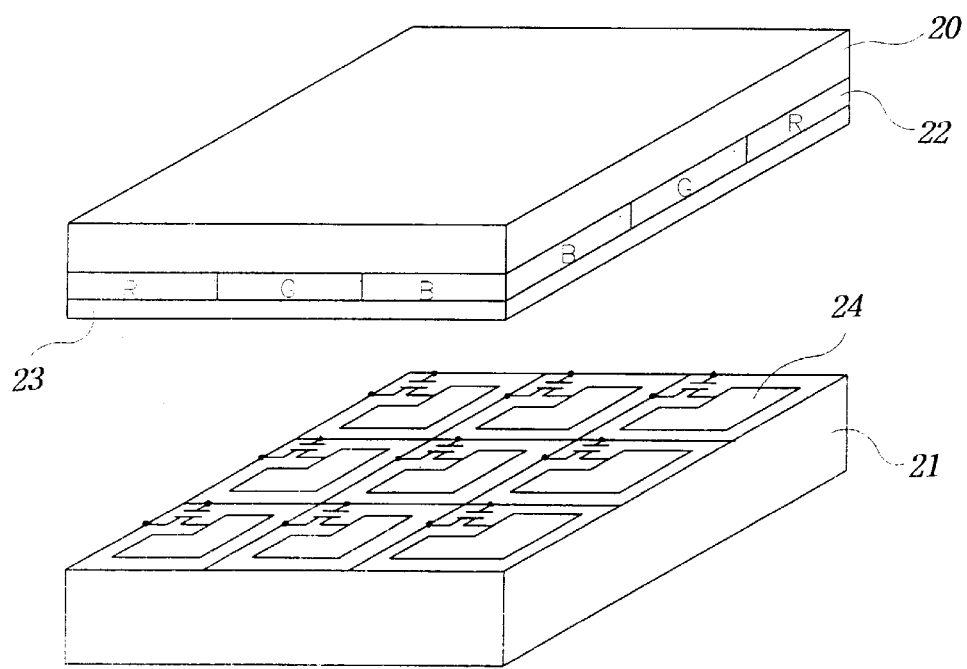
FIGS. 2a–2b shows the upper and lower plate of the conventional liquid crystal display device.
Figure 2B:
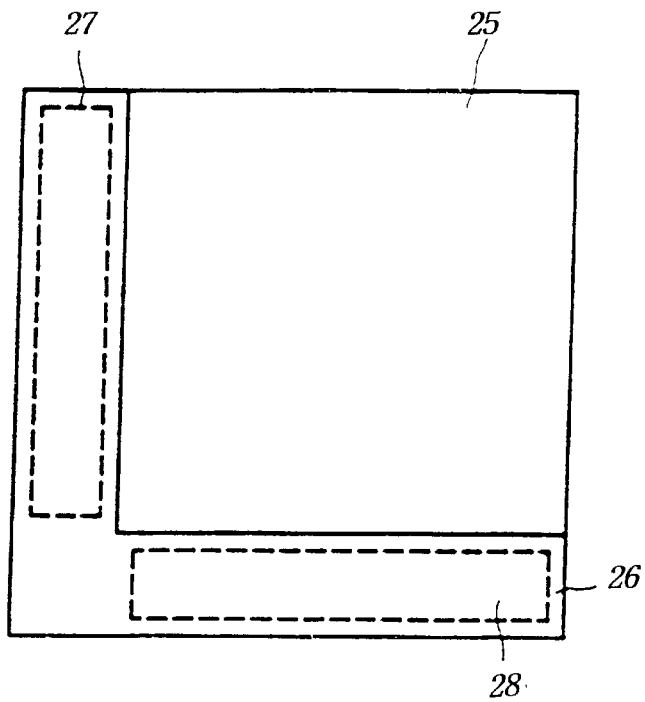
Figure 3:
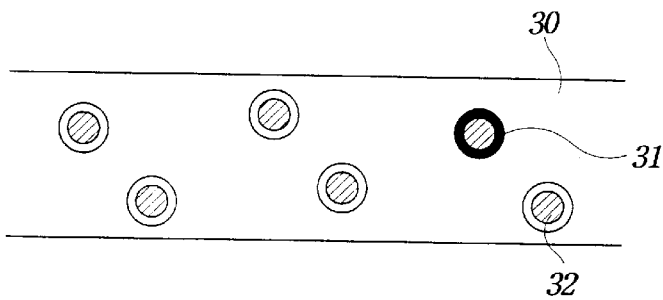
FIG. 3 is a cross-sectional view of the structure of the conventional anisotropic conductive film.
Figure 4A:
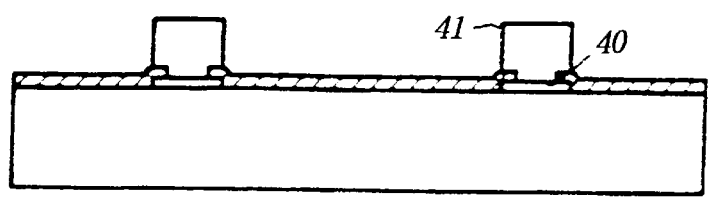
FIGS. 4a–4c shows the general process of the tape automated bonding in the conventional method.
Figure 4B:
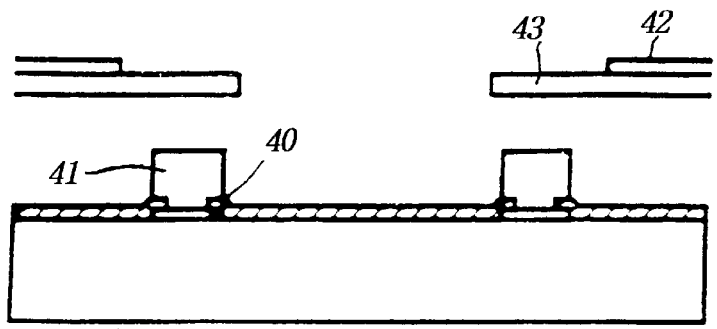
Figure 4C:
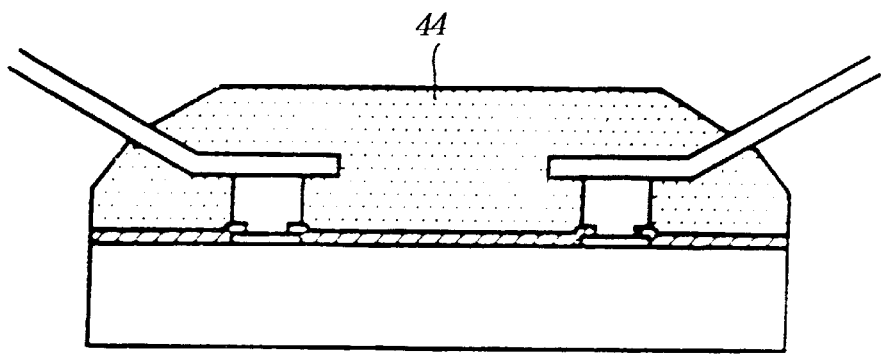
Figure 5A:
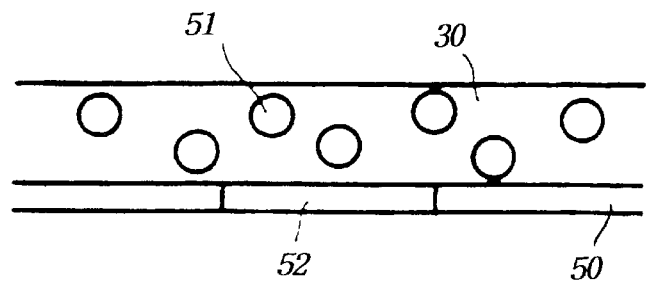
FIGS. 5a–5b shows the general process of the chip on glass in the conventional method.
Figure 5B:
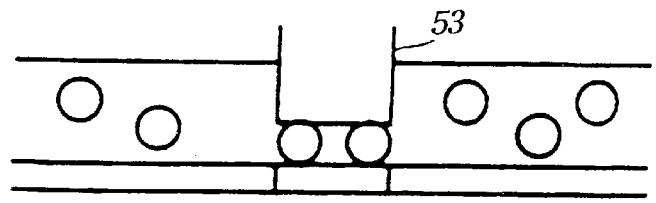
Figure 6A:
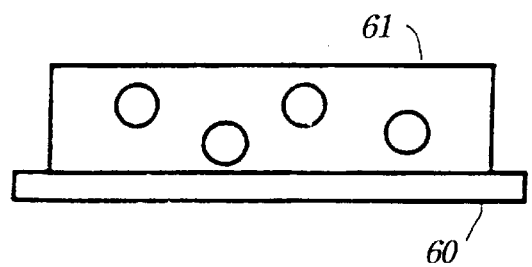
FIGS. 6a–6c shows the process of the adhering an anisotropic conductive film to the plate of the liquid crystal device.
Figure 6B:
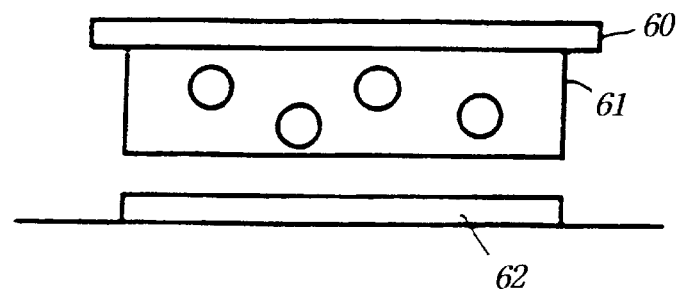
Figure 6C:
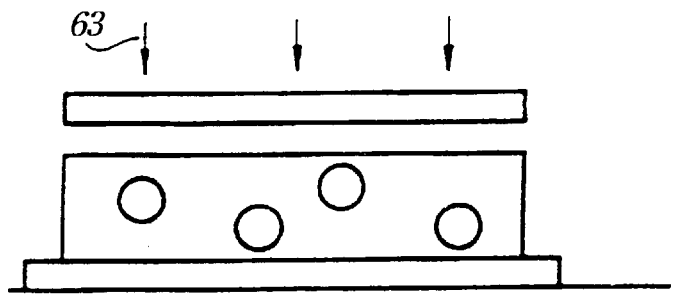
Figure 7A:
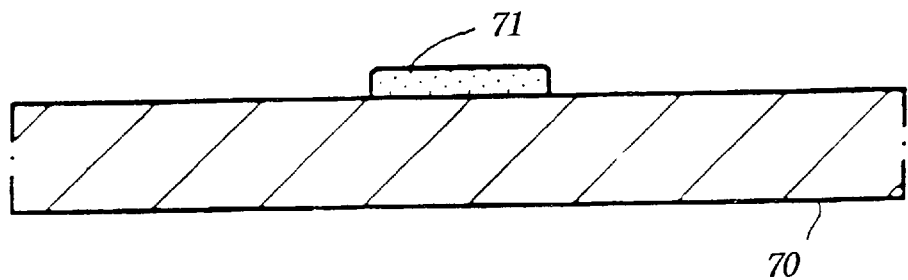
FIGS. 7a–7e is a cross-sectional view of the conventional method for manufacturing the liquid crystal display device.
Figure 7B:
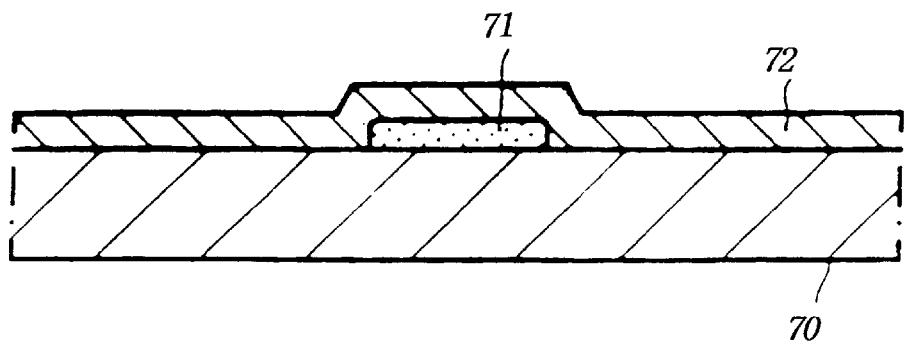
Figure 7C:
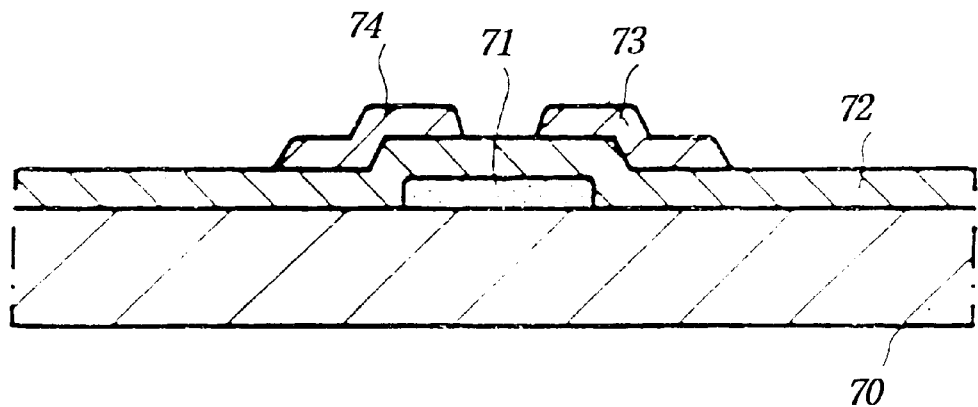
Figure 7D:
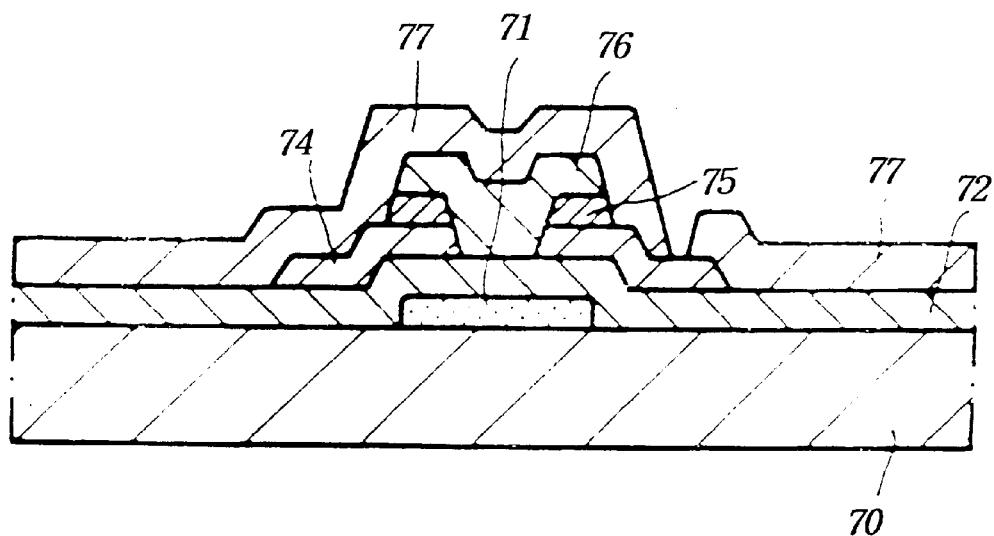
Figure 7E:
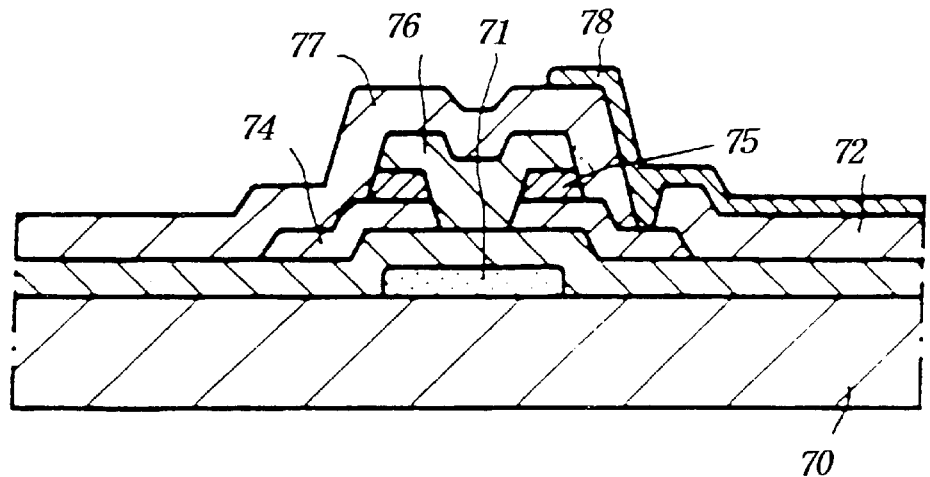
Figure 8A:
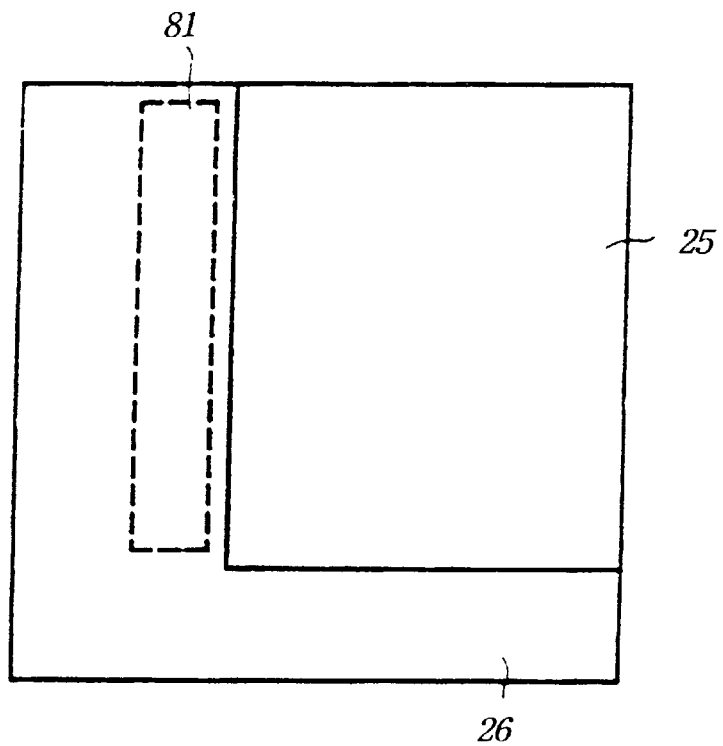
FIGS. 8a–8d shows the process of the adhering an anisotropic conductive film to the lower plate of the liquid crystal device in the conventional method.
Figure 8B:
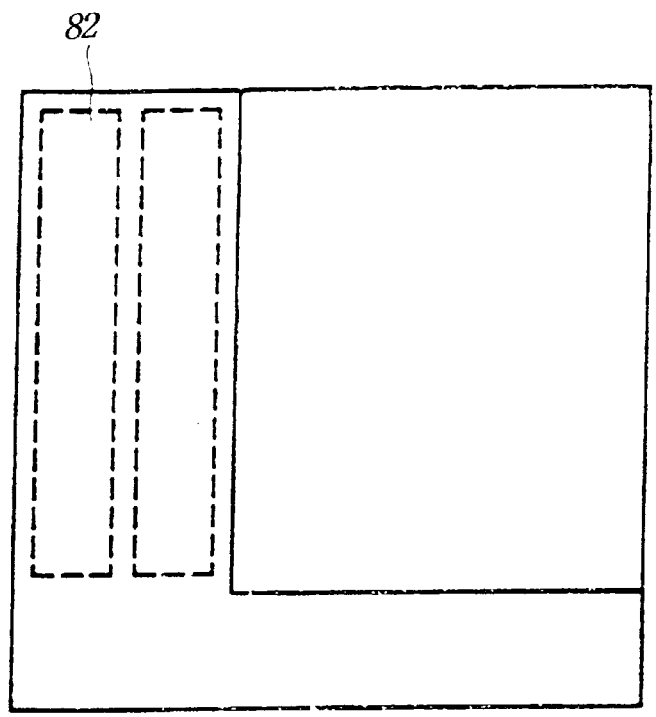
Figure 8C:
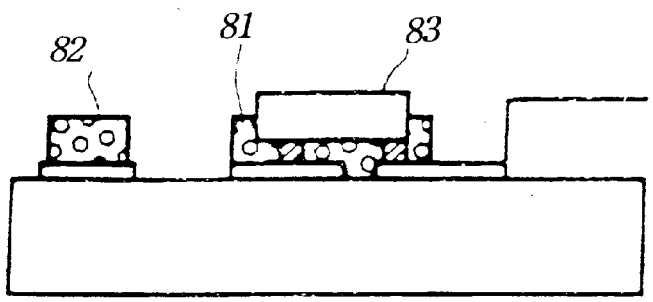
Figure 8D:
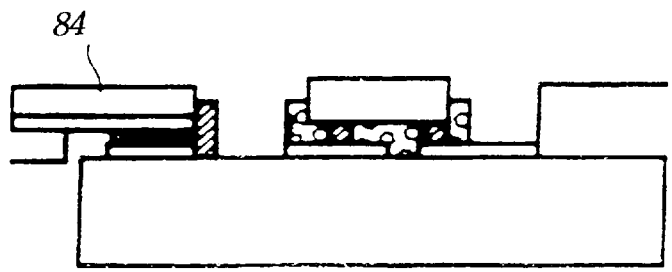
Figure 9A:
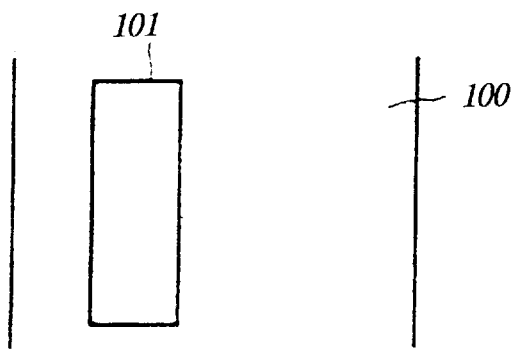
FIGS. 9a–9b is the plan view showing the process a film having two strips of anisotropic conductive film in the present invention.
Figure 9B:
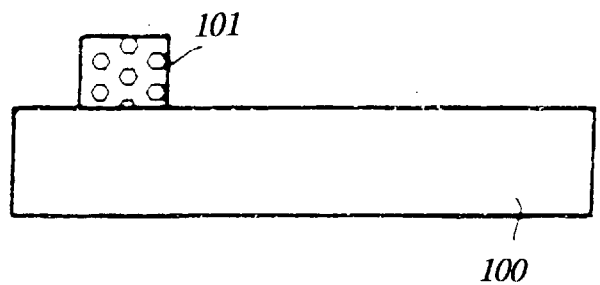
Figure 10A:
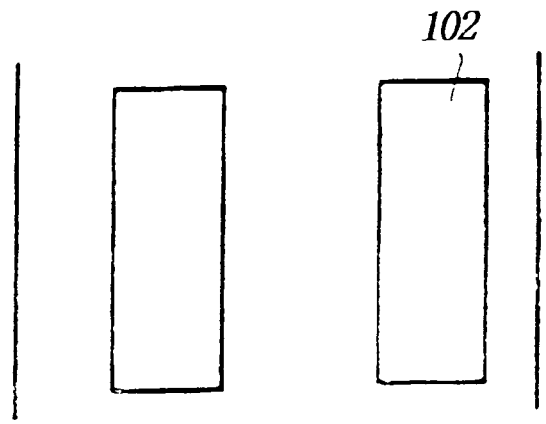
FIGS. 10a–10b is the cross-sectional view showing the process a film having two strips of anisotropic conductive film in the present invention.
Figure 10B:
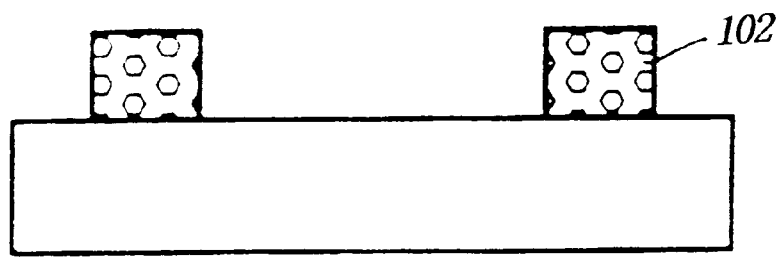

Referring to the FIGS. 9 and 10, one example of the present invention is explained. On a protection film 100, a first ACF 101 is weekly adhered. If the first ACF is for the COG, then the width is proper to connect the driver IC and the terminal of LCD bus lines, as shown FIG. 9a and FIG. 9b, the cross-sectional view of the FIG. 9a. If the first ACF 101 is for the FPC, then the width is proper to mount the FPC. And then, a second ACF 102 is weekly adhered near the first ACF 101 with certain distance, as shown FIG. 10a and FIG. 10b, the cross sectional view of FIG. 10a. Here, if first ACF is for the COG, then the second ACF must be for the FPC, or vice versa.

In this case, if the alignment of the two kind of ACFs is needed to be exactly, then an alignment mark should be set on the surface of the protection film 100. The alignment mark help to set the ACFs on the exact position. Additionally, if an another alignment mark is set on the LCD panel, then the setting of the ACF is very exactly by accordance the alignment mark of the protection film and that of the LCD panel.

Preferred Embodiment 2

Figure 11A:
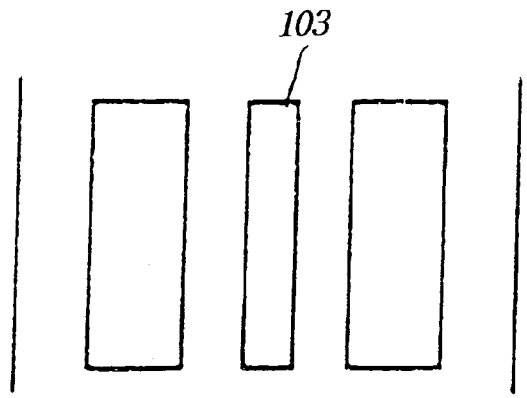
FIGS. 11a–11b shows a film having two strips of the anisotropic conductive film and a protection dam being between the two anisotropic conductive films.
Figure 11B:
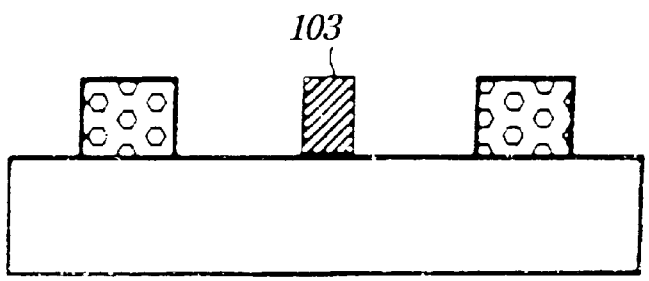

Referring to the FIGS. 11a and 11b, another example of the present invention further comprises a protection dam 103 between the first ACF and the second ACF. The protection dam 103 is for protecting the mixing the two ACFs and the beside electrodes by heat occurred when the driver IC or the FPC is adhered with the terminals. For example, when the driver IC is adhered to first ACF, the first ACF is hotter than the glass translation temperature(Tg) and the adhesive resin in the first ACF melts and flows to the second ACF. The protection dam 103 is a protection of heat or melted resin transition.

Preferred Embodiment 3

Figure 12A:
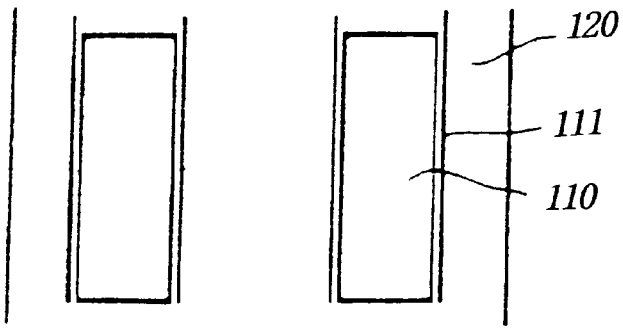
FIGS. 12a–12b shows a film structure having a protection film and the two kind of the conventional anisotropic conductive films with sub protection films in the present invention.
Figure 12B:
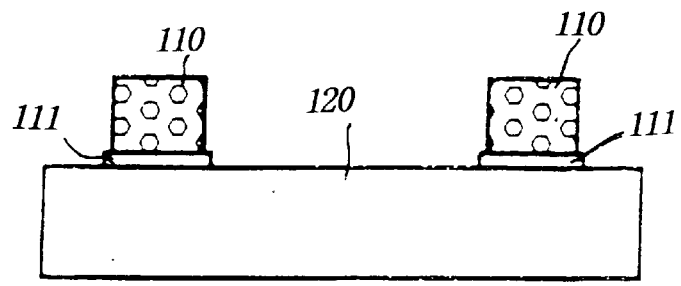

Referring to the FIGS. 12a and 12b, still another example of the present invention comprises a main protection film 120 having two protection films 111 having a ACF 110 each other. This embodiment have a structure in which the conventional two ACFs for COG and to FPC are aligned together in one main protection film. So, after the ACFs are mounted on the terminal or electrode, the main protection film is removed whereas the protection films are remain. Therefore, the remained protection film can be used other purposes.

Preferred Embodiment 4

Figure 13:
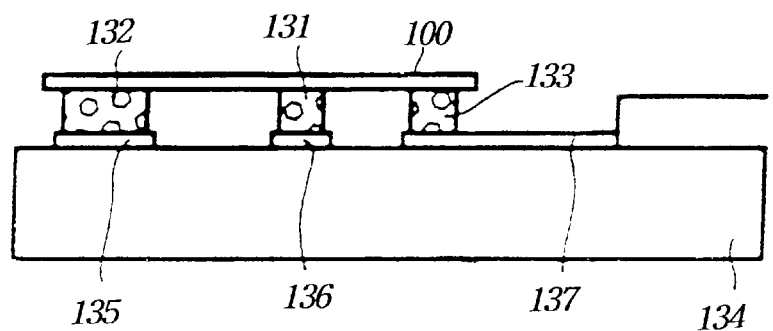
FIG. 13 is a cross-sectional view showing a film having three kinds of anisotropic conductive film.

Referring to the FIG. 13, yet another example of the present invention comprises more ACFs than two. For example, this embodiment comprises a protection film 100, a first ACF 132 for FPC, a second AFC 131 for input terminal of driver IC and a third AFC 133 for connecting the output terminal of the driver IC with the terminal pad of the LCD.

Preferred Embodiment 5

Figure 14:
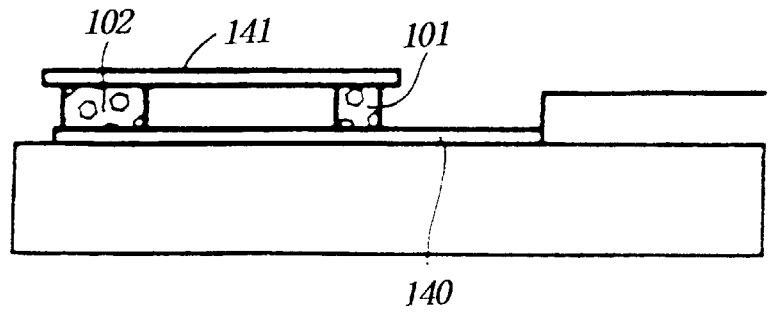
FIG. 14 shows that the spirit of the present invention is applied to the conventional tape automated bonding method.

Referring to the FIG. 14, the other example of the present invention is to expand the sprit of the present invention to the conventional TAB method. In the TAB method, the two kind of ACFs are set on a one protection film in order to enhance the accuracy of the alignment.

Figure 15A:
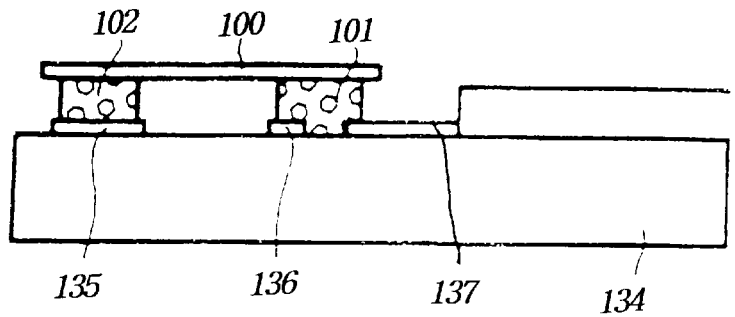
FIGS. 15a–15d shows a process of connecting a driver IC and a FPC to the plate of the liquid crystal display device using an anisotropic conductive film made by the present invention.
Figure 15B:
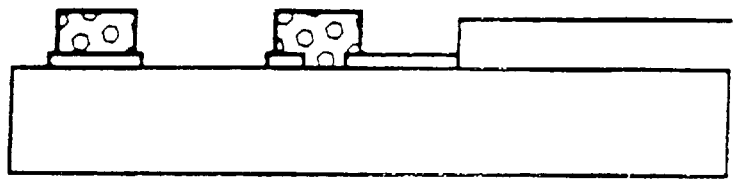
Figure 15C:
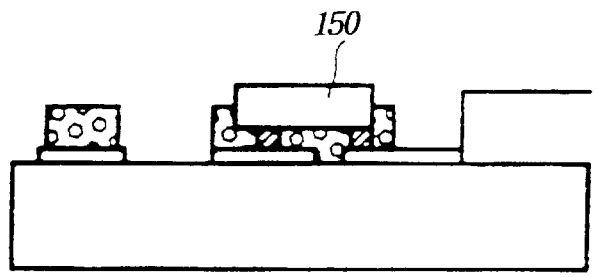
Figure 15D:
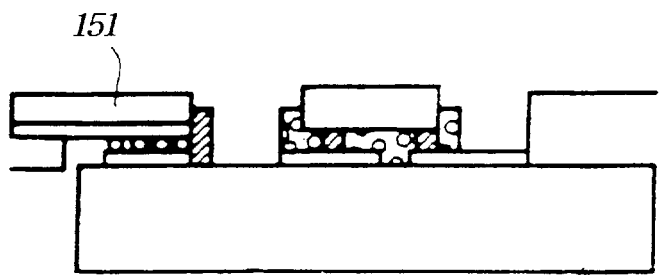

Hereinafter, we explain about the structure of the ACF according to the present invention. Now, we simply explain about an example of the usage in the LCD as shown in FIG. 15. As the result of the preferred embodiment 1, on the ACFs (FIG. 10b) mounted on the LCD panel. The ACF for COG 101 is covered the input terminal of driver IC 136 and the terminal pad of the LCD. The ACF for FPC 102 is covered the output terminal of the FPC, as shown FIG. 15a. On the protection film 100, pressure and heat are applied, then the ACFs 102, 101 adhere to the LCD panel 134 and the protection film 100 is removed, as shown in FIG. 15b. And driver IC 150 is connected to the input terminal and the terminal pad of the LCD by the ACF for COG 101, as shown in FIG. 15c. Finally, the FPC 151 is connected to the ACF for the FPC 102.

THE ADVANTAGES OF THE PRESENT INVENTION

In conventional method for mounting the driver IC and FPC, there are two steps in which the one is to adhere an ACF for COG and connect the driver IC using the ACF for COG, the other is to adhere an ACF for FPC and connect the FPC using the ACF for FPC. However, in the present invention, the step of adhering the ACF for COG and FPC is performed at the same time. So, the manufacturing process is simpler than conventional art.

Furthermore, in the conventional method for adhering the ACFs, it is needed to align the ACFs at each time. However, in the present invention, the ACFs are prealigned at the manufacturing the ACF. So, when the ACF is mounted on the device, if only one ACF is aligned then the other is aligned automatically. So, there is no problems in alignment between the ACFs.

What is claimed is:

1. A film comprising:

a protection film;

a first anisotropic conductive film comprising an adhesive resin and conductive sphere body being covered by a protection membrane in the resin; and a second anisotropic conductive film near the first anisotropic conductive film.

2. According to the claim 1, the first anisotropic conductive film and the second anisotropic conductive film being the same material and having same structure.

3. According to the claim 1, the thicknesses of the first anisotropic conductive film and the second anisotropic conductive film being the same.

4. According to the claim 1, further comprising a protection dam between the first anisotropic conductive film and the second anisotropic conductive film.

5. According to the claim 4, the thickness of the protection dam being same with that of the one of the first and second anisotropic conductive film.

6. According to the claim 1, further comprising a sub protection film being adhere to one side of the first anisotropic conductive film.

7. According to the claim 1, further comprising a sub protection film being adhere to one side of the second anisotropic conductive film.

8. According to the claim 1, further comprising a third anisotropic conductive film near the second anisotropic conductive film.

9. According to the claim 1, further comprising an alignment mark between the first anisotropic conductive film and the second anisotropic conductive film.

10. An liquid crystal display device comprising:

an upper plate comprising a common electrode and a color filter layer; and a lower plate comprising a first area having a TFT array in accordance with the upper plate and a second area having a film comprising first and second anisotropic conductive films, wherein the first anisotropic conductive film includes an adhesive resin and a conductive sphere body covered by a protection membrane in the resin and the second anisotropic conductive film is positioned near the first anisotropic conductive film.

11. According to the claim 10, wherein the film further comprises a third anisotropic conductive film.

12. According to the claim 10, wherein the lower plate further comprises an alignment mark.

13. A method for manufacturing a film comprising:

a step of adhering a first anisotropic conductive film on the film; and a step of adhering a second anisotropic conductive film near the first anisotropic conductive film.

14. According to the claim 13, further comprising a step of adhering a protection dam between the first and the second anisotropic conductive films.

15. According to the claim 13, further comprising a step of adhering a third anisotropic conductive film near the second anisotropic conductive film.

16. According to the claim 13, further comprising a step of marking an alignment mark on the film.

17. A method for manufacturing a liquid crystal display comprising:

a step of forming a TFT array and a terminal pad connecting the TFT array on a substrate;

a step of forming a input terminal near the terminal pad;

a step of forming a FPC terminal near the input terminal;

a step of adhering a film comprising two anisotropic conductive films on the substrate, whereas the one anisotropic conductive film is on the terminal pad and the input pad, and the other anisotropic conductive film is on the FPC terminal; and a step of removing the film form the first and the second anisotropic conductive films.

18. According to the claim 17, wherein the step of adhering the film, the film further comprises a third anisotropic conductive film.

19. According to the claim 17, further comprising a step of marking an alignment mark for align the film between the terminal pad and the input terminal on the substrate.

20. According to the claim 17, further comprising a step of marking an alignment mark for align the film between the input terminal and the FPC terminal on the substrate.

* * * * *